United States Patent
Maki et al.

(10) Patent No.: US 8,168,452 B2
(45) Date of Patent: May 1, 2012

(54) METHOD FOR MANUFACTURING SEMICONDUCTOR DEVICE

(75) Inventors: Keigo Maki, Nagano (JP); Daisuke Ito, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/954,714

(22) Filed: Nov. 26, 2010

(65) Prior Publication Data

US 2011/0136270 A1     Jun. 9, 2011

(30) Foreign Application Priority Data

Dec. 4, 2009  (JP) ................................. 2009-276554

(51) Int. Cl.
*H01L 21/00* (2006.01)
(52) U.S. Cl. ............. 438/17; 438/613; 438/617; 257/48
(58) Field of Classification Search .................. 438/613, 438/617, 17; 257/48
See application file for complete search history.

(56) References Cited

U.S. PATENT DOCUMENTS 5,906,312 A * 5/1999 Zakel et al. .................. 228/246
6,514,783 B1 * 2/2003 Welstand ........................ 438/31

FOREIGN PATENT DOCUMENTS

JP    2001-230374    8/2001
JP    2007-227478    9/2007

* cited by examiner

*Primary Examiner* — Jarret Stark
*Assistant Examiner* — Nicholas Tobergte
(74) *Attorney, Agent, or Firm* — IPUSA, PLLC

(57) ABSTRACT

A method for manufacturing a semiconductor device, the semiconductor device including an integrated circuit having plural connection terminals arranged on a predetermined local region of the integrated circuit, plural metal bumps, and a wiring layer connected to at least a portion of the connection terminals via the plural metal bumps, the method includes the steps of a) measuring an impedance value of the predetermined local region of the integrated circuit, b) determining whether the measured impedance value matches a predetermined impedance value, c) determining positions of the plural metal bumps in accordance with the determination result of step b), d) forming the plural metal bumps on the positions determined in step c), and e) forming the wiring layer on the plural metal bumps.

9 Claims, 12 Drawing Sheets

FUSE   1    2    3    4    5

| FUSE NO | ON/OFF |
|---|---|
| 1 |  |
| 2 | OFF |
| 3 |  |
| 4 | OFF |
| 5 |  |

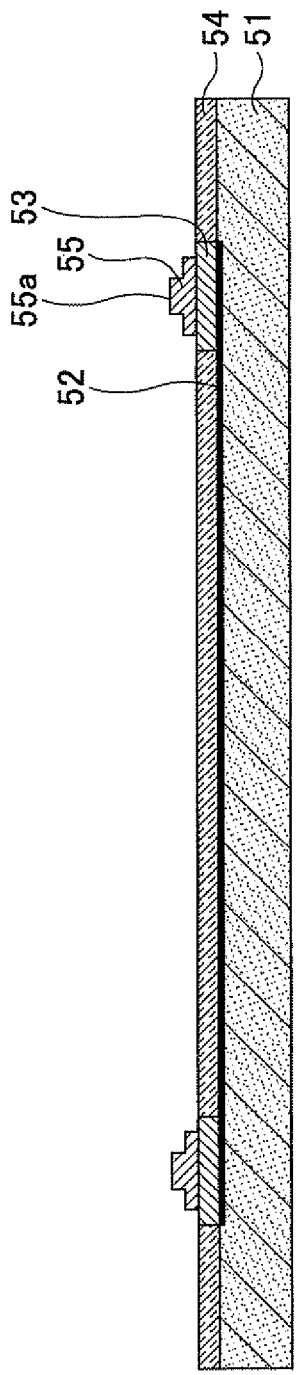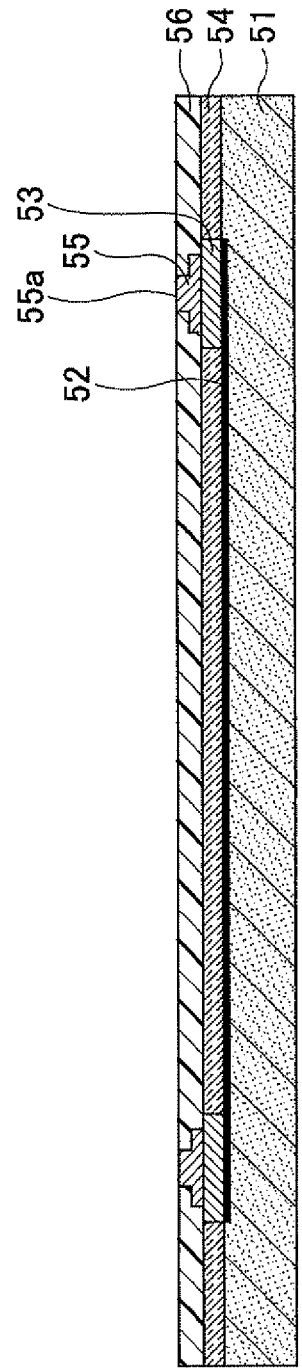

METHOD FOR MANUFACTURING SEMICONDUCTOR DEVICE

BACKGROUND OF THE INVENTION

1. Field of the Invention

The present invention generally relates to a method for manufacturing a semiconductor device, and a wafer level package on which the semiconductor device is mounted.

2. Description of the Related Art

In manufacturing integrated circuits, a process referred to as trimming is used for adjusting (modifying) characteristic values of an integrated circuit (e.g., resistance value). The trimming process is performed on a target trimming device provided on the same plane of an integrated circuit plane. By performing the trimming process, the status of a circuit (open state, short-circuited state) is changed. For example, with a Zener zap method, a circuit is changed from an open state to a short-circuited state by using a Zener diode in a circuit. With a polysilicon fuse method, a fuse of polysilicon is changed from a short-circuited state to an open state. As for other trimming processes, there is a laser cutting method.

FIGS. 1A-1C are schematic diagrams for describing conventional trimming processes. FIG. 1A is for describing the Zener zap method. In a case where a reverse voltage is applied to a PN junction diode 11 (see upper part of FIG. 1A) and a Zener breakdown is generated by overvoltage, a permanent conductive state is created at a location 12 of the PN junction diode 11 (see lower part of FIG. 1A). Accordingly, in a case where a predetermined location of a wiring of an integrated circuit is required to be in a conductive state, a trimming process is performed by providing the PN junction diode 11 at the predetermined location of the integrated circuit.

FIG. 1B is for describing the polysilicon fuse method. In a case where overcurrent is allowed to flow through a polysilicon resistor element 13 (see upper part of FIG. 1B) formed on a silicon oxide film and heated to a temperature equal to or more than a melting point, the polysilicon resistor element 13 is melted off (see lower part of FIG. 1B). Accordingly, in a case where a predetermined location of a wiring of an integrated circuit is required to be in an open state, the trimming process (polysilicon fuse method) is performed by providing the polysilicon resistor element 13 at the predetermined location of the integrated circuit.

FIG. 1C is for describing the laser cutting method. In a case where a laser beam is irradiated to a fuse element 14 (see upper part of FIG. 1C) provided at a portion of an integrated circuit, the fuse element 14 is cut off (see lower part of FIG. 1C). Accordingly, in a case where a predetermined location of an integrated circuit is required to be in an open state, a trimming process (laser cutting method) is performed by providing the fuse element 14 at the predetermined location of the integrated circuit (See, for example, Japanese Laid-Open Patent Publication No. 2001-230374).

FIG. 2A is a schematic diagram and FIG. 2B is a table for describing a trimming process by using the laser cutting method, respectively. According to FIGS. 2A and 2B, an integrated circuit can be made open by melting off the fuses corresponding to No. 2 and No. 4. Thereby, the resistance values of the integrated circuit can be controlled within permissible design values.

Further, as for methods besides heating and melting fuses, there is a method of adjusting characteristic values of a circuit (e.g., resistance values) by arranging connection wiring between resistors in an integrated circuit. That is, after forming semiconductor elements, and measuring resistance values of the semiconductor elements, connection wiring may be formed between resistors on an integrated circuit (including the processes of forming an interlayer insulation film and through-holes using various masks, depositing/processing an aluminum film) in the middle of a semiconductor device manufacturing process based on the measured resistance values (see, for example, Japanese Laid-Open Patent Publication No. 2007-227478).

The conventional trimming processes using methods such as the Zener zap method or the polysilicon fuse method electrically destroys the target trimming elements formed on the same plane of an integrated circuit by applying high voltage or by allowing high electric current to flow with respect to the target trimming elements. The target trimming elements are to be arranged sufficiently spaced apart from each other on an integrated circuit for preventing other circuit elements from being thermally or electrically affected by the target trimming elements. This causes the area of the integrated circuit to increase and causes difficulty in achieving high density integration.

Although the use of the laser cutting method does not require high voltage or high current for destroying target trimming elements, positioning regions for performing laser irradiation and regions used for forming elements besides the integrated circuit (e.g., regions for forming openings for passing a laser beam through) are required to be formed on the same plane of the semiconductor circuit. Therefore, the size of the semiconductor circuit cannot be sufficiently reduced. Further, because the laser cutting method requires equipment for performing the trimming process and additional procedures for performing the trimming process, it is difficult to reduce manufacturing costs and simplify the manufacturing process.

Although target trimming elements are not melted off in a case of using a method of newly forming connection wiring (e.g., aluminum) between resistors, this method is unable to reduce manufacturing costs or simplify the manufacturing process because this method requires plural masks and forming wirings.

As another method, there is a method of changing a redistribution wiring configuration by performing wafer level packaging (WLP) on a semiconductor integrated circuit. However, the method of changing the redistribution wiring configuration is unable to reduce manufacturing costs and to simplify the manufacturing process because the method requires plural masks and forming wiring (e.g., plating) in order for the semiconductor circuit to attaining characteristic values within a permissible range.

SUMMARY OF THE INVENTION

The present invention may provide a method for manufacturing a semiconductor device that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method for manufacturing a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a method for manufacturing a semiconductor device, the semiconductor device including an integrated circuit having plural connection terminals arranged on a predetermined local region of the integrated circuit, plural metal bumps, and a wiring layer connected to at least a portion of the connection terminals via the plural metal bumps, the method includes the steps of a) measuring an impedance value of the predetermined local region of the integrated circuit, b) determining whether the measured impedance value matches a predetermined impedance value, c) determining positions of the plural metal bumps in accordance with the determination result of step b), d) forming the plural metal bumps on the positions determined in step c), and e) forming the wiring layer on the plural metal bumps.

Other objects and further features of the present invention will be apparent from the following detailed description when read in conjunction with the accompanying drawings.

BRIEF DESCRIPTION OF THE DRAWINGS

FIGS. 5A-5F are schematic diagrams illustrating a representative example of the shape of a wafer level package (WLP) performed in the steps of the method for manufacturing a semiconductor device according to an embodiment of the present invention;

DESCRIPTION OF THE PREFERRED EMBODIMENTS

In the following, embodiments of the present invention will be described with reference to the accompanying drawings.

First Embodiment

Steps of Manufacturing Method

Figure 1C:
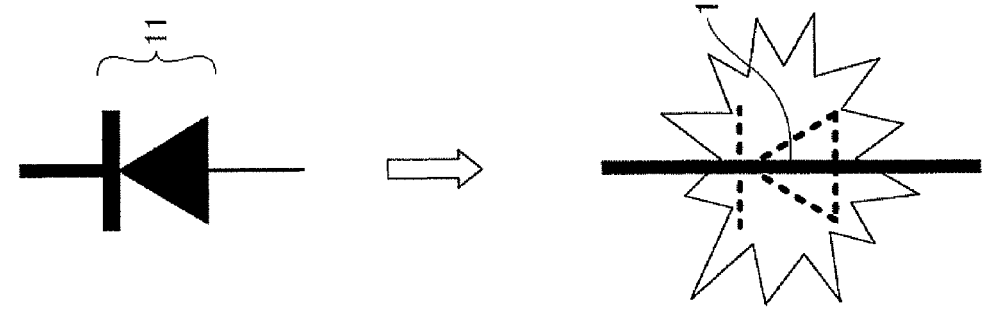
FIGS. 1A-1C are schematic diagrams for describing conventional trimming processes.
Figure 1B:
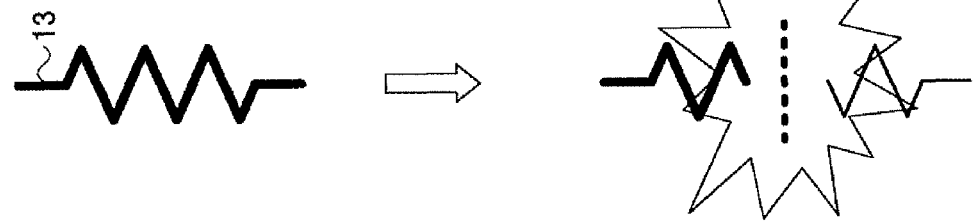
Figure 1A:
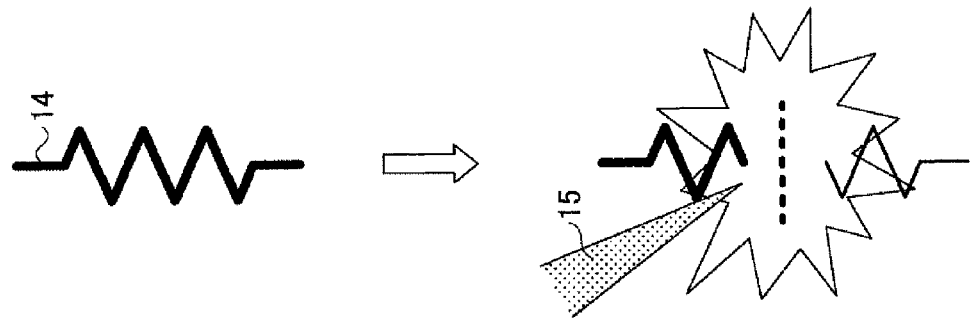
Figures 2A, 2B:
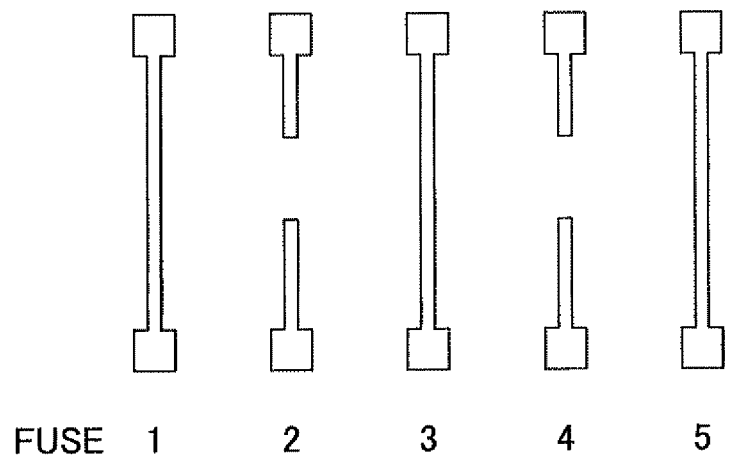
FIG. 2A is a schematic diagram for describing a trimming process by using the laser cutting method.
FIG. 2B is a table for describing a trimming process by using the laser cutting method.
Figure 3:
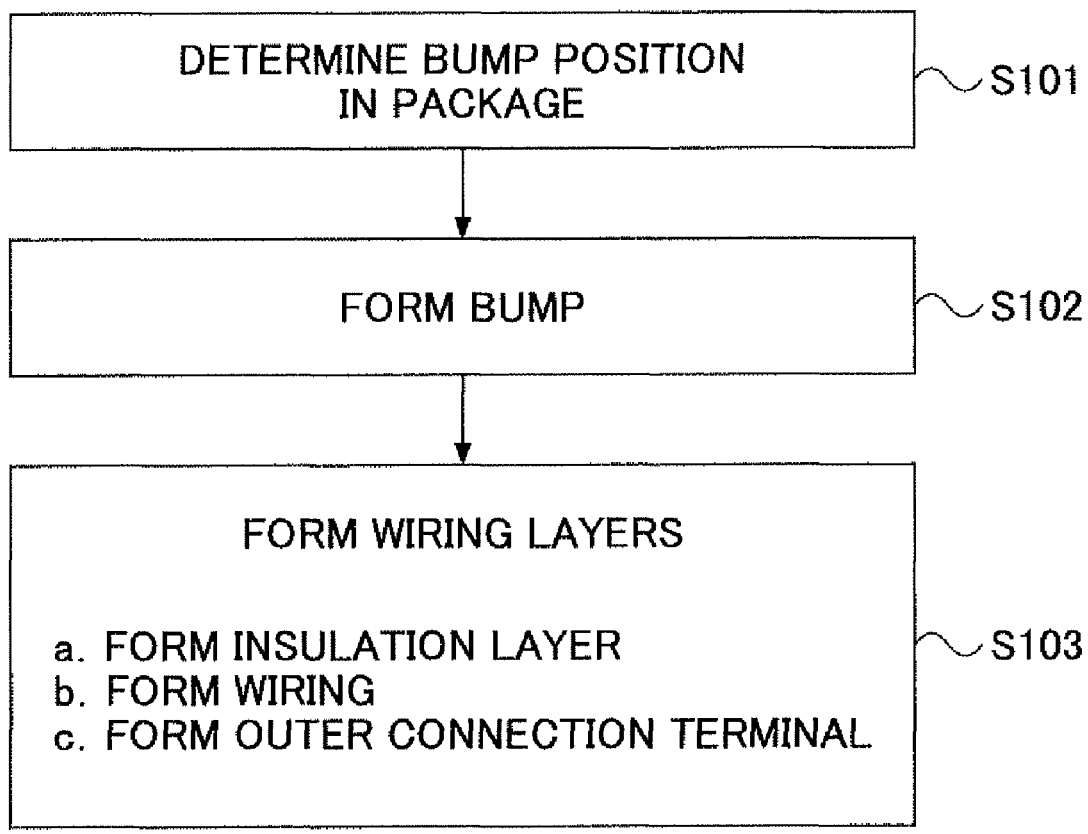
FIG. 3 is a schematic diagram illustrating an example of a method for manufacturing a semiconductor device according to the first embodiment of the present invention.

FIG. 3 is a schematic diagram illustrating an example of a method for manufacturing a semiconductor device according to the first embodiment of the present invention. The method for manufacturing the semiconductor device includes the steps of determining the position of bumps in a package (Step S101), forming the bumps (Step S102), and forming wiring layers (Step S103). In the step of forming the bumps, a wire bonding apparatus may be used to form the bumps.

Figure 4:
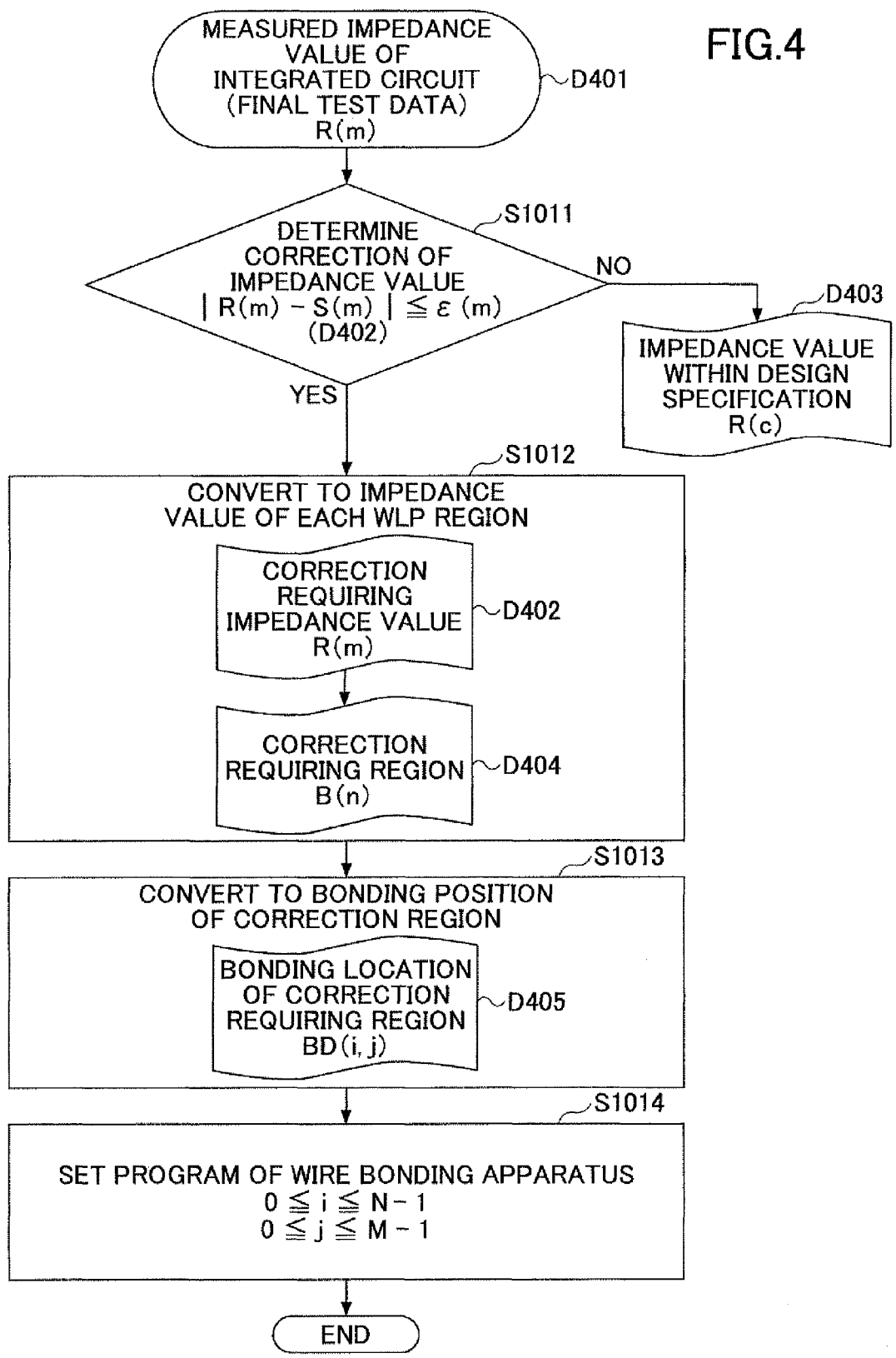
FIG. 4 illustrates step S101 of the method in FIG. 3 in further detail.

FIG. 4 illustrates the step S101 in further detail. In FIG. 4, D401-D405 indicate data used or obtained by performing Step 101.

FIGS. 5A-5F are schematic diagrams illustrating a representative example of the shape of a wafer level package (WLP) performed in the steps of the method for manufacturing a semiconductor device according to an embodiment of the present invention.

Figure 6A:
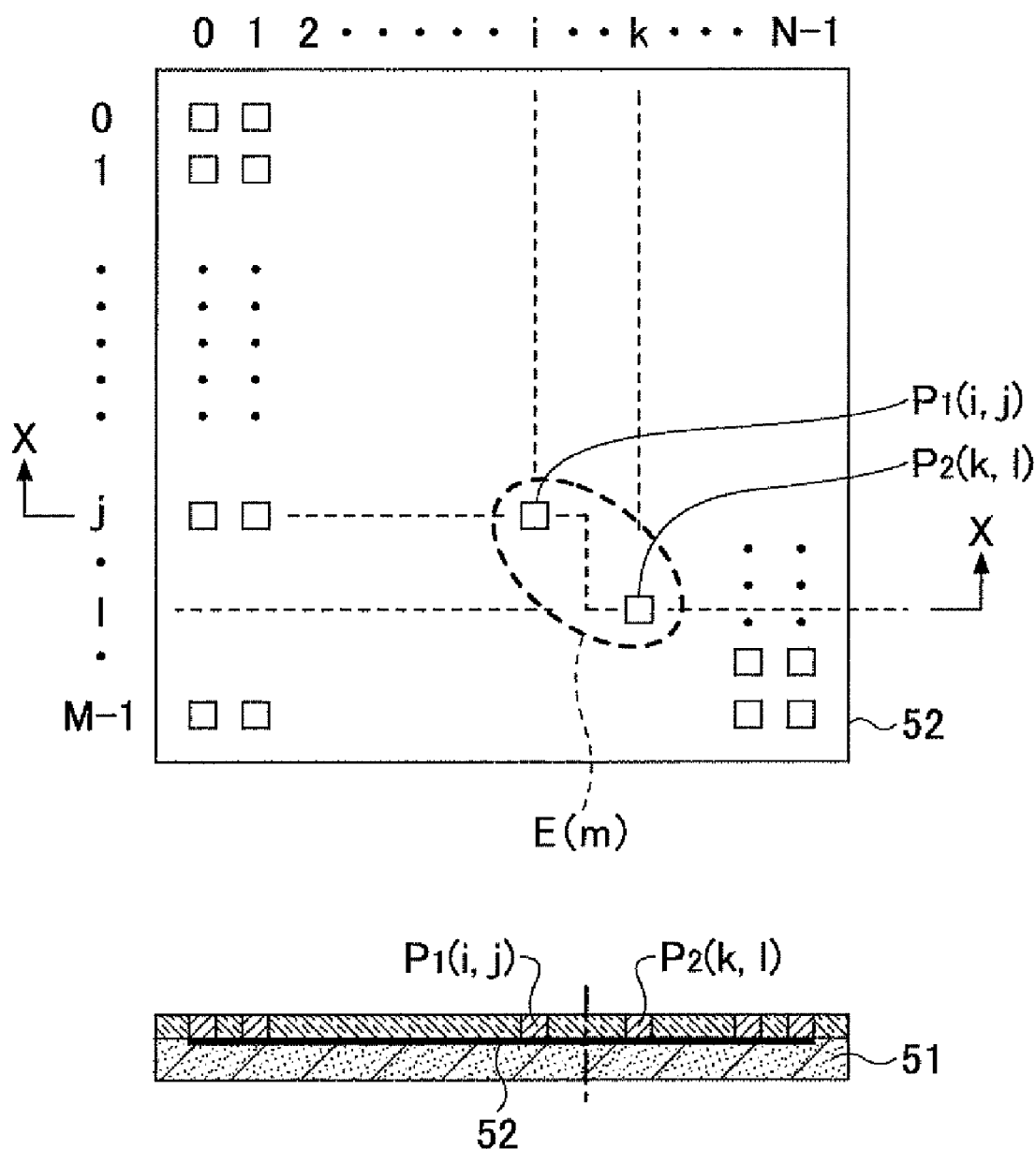
FIGS. 6A-6C are schematic diagrams illustrating the positions of terminals of a semiconductor integrated circuit element and connection bumps of a WLP according to an embodiment of the present invention.
Figure 6B:
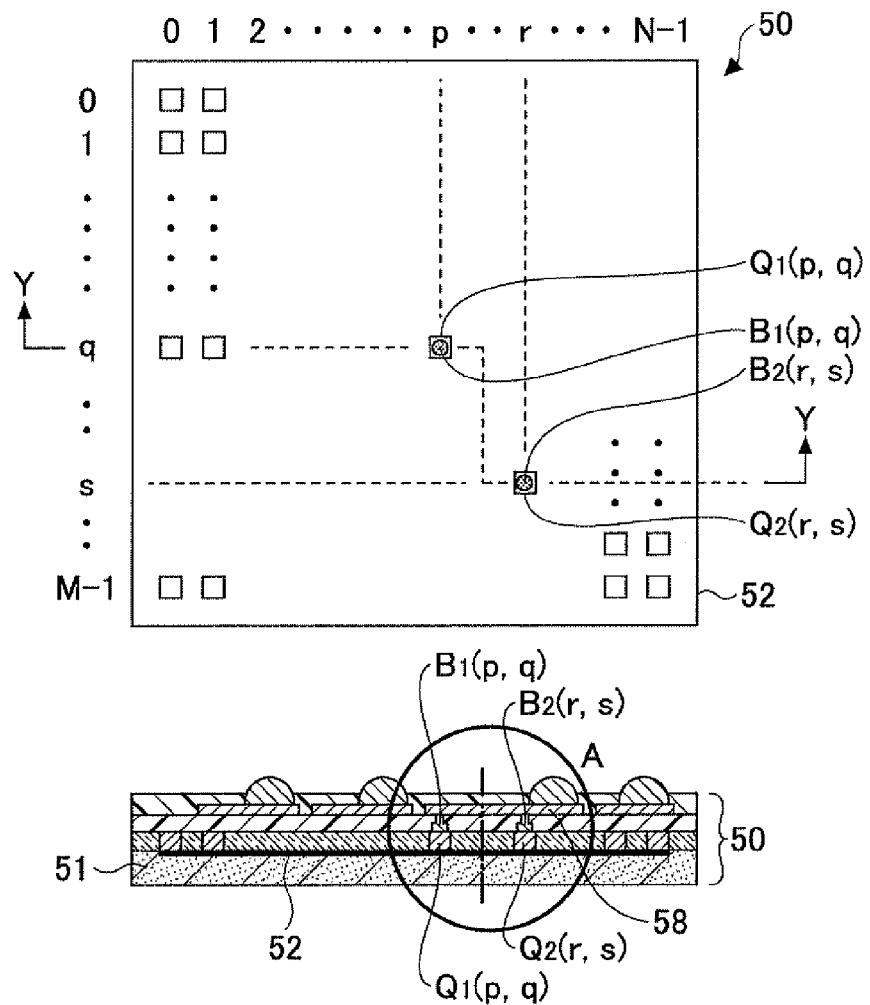
Figure 6C:
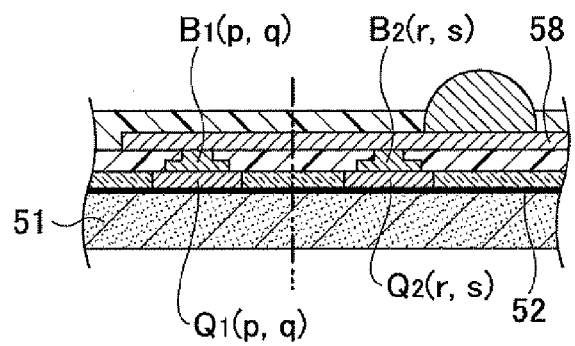

FIGS. 6A-6C are schematic diagrams illustrating the positions of terminals of a semiconductor integrated circuit element and connection bumps of a WLP according to an embodiment of the present invention. The groups of terminals illustrated in FIGS. 6A-6C indicate groups of terminals positioned in association with the impedance value of local regions of the integrated circuit according to an embodiment of the present invention.

Next, the steps of the method for manufacturing a semiconductor device illustrated in FIGS. 3 and 4 are described in detail with reference to the shapes of the WLP illustrated in FIGS. 5A-5F and the arrangement of the groups of terminals illustrated in FIGS. 6A-6C.

[Step S101, Determining Bump Position in Package]

The step of determining the position of bumps in a package includes the steps of determining whether the measured impedance value is to be corrected (Step S1011), converting the measured value to an impedance value of each WLP region (Step S1012), converting correction region data to bonding condition data (Step S1013), and setting a program of a wire bonding apparatus (Step S1014).

[Step 1011, Determining Whether Correction of Impedance Value is Necessary]

Step S1021 of FIG. 4 illustrates a step of determining whether correction of an impedance value is necessary. First, a value is obtained by measuring each pair of terminals (target measurement terminals) in each target region of an integrated circuit element during the final testing (FT) of the integrated circuit. The obtained value is used as the impedance value for determining whether the impedance value correction is necessary. Design specifications such as impedance values are specified for each region based on specific design specifications. An impedance value R(m) of a local area E(m) ("m" is a natural number indicating a local area in the integrated circuit), at which the target measurement terminals are located, is compared with a design specification value S(m) specified for the integrated circuit. The necessity of correcting the impedance value is determined based on a predetermined permissible range which is permissible according to the design specification value S(m). The permissible range with respect to the design specification value S(m) is set based on, for example the physical properties of a semiconductor device, the conditions of using the integrated circuit device, and the like. For example, the following formula expressing the permissible value $\epsilon$ (m) with respect to the design specification value S (m) is used for determining whether the necessity of correcting the impedance value.

$$|R(m)-S(m)|\leq\epsilon(m) \quad \text{[Formula 1]}$$

In a case where the Formula 1 is not satisfied, that is, in a case where the difference between the impedance value R(ma) of a given local area E (ma) obtained by the final test (FT) and the design specification value S(ma) exceeds a permissible range $\epsilon$ (ma), the impedance value RX (ma) of the local area E (ma) is stored as correction requiring impedance value data D402 in a list indicating impedance values of local regions that require correction.

It is to be noted that the term "local" of local region E(m) is to emphasize that each of the regions of an integrated circuit has a unique impedance value. Unless described otherwise, the term "region" has substantially the same meaning as "local region".

The data D402 are used for converting the impedance value of each region of the WLP in the subsequent Step S1012.

Further, in a case where the impedance value of a certain region obtained in the final test is within a permissible design specification range or matches a predetermined impedance value in the permissible design specification range, the impedance value of the certain region is stored as permissible impedance value data D403 (data of impedance value within the permissible design) in a list indicating impedance values that require no correction (indicated as "R(c)").

[Step 1012, Conversion of Impedance Value for Each Region in WLP]

In Step S1012 of FIG. 4, conversion of the impedance value for each region of a WLP is performed by performing calculation based on the correction requiring impedance value data D402. The term "region of a WLP" indicates each local part of a WLP having an impedance value generated by the wiring structure of the WLP and corresponds to the local region E(m) from which the impedance value of the integrated circuit is measured.

FIG. 6A illustrates an example of terminals of an integrated circuit 52 on a wafer 51. In this example, among the terminals arranged in a grid-like manner (row M, column N), the impedance values R(m) of two terminals P1 (i, j) and P2 (k, l) are measured in the FT (final test), in which $0 \leq i$, $k \leq N-1$, $0 \leq j$, and $1 \leq M-1$. In this example, the terminals P1 (i, j) and P2 (k, l) are measurement terminals used for measuring the impedance values of the local region E(m). The lower part of FIG. 6A is a cross-sectional view of the wafer 51 and the integrated circuit 52 taken along arrows X-X of the upper part of FIG. 6A.

FIG. 6B illustrates an example of terminals and connection bumps of a wafer level package (WLP) 50 having the integrated circuit 52 mounted on the wafer 51 according to an embodiment of the present invention. The lower part of FIG. 6B is a cross-sectional view illustrating an overall configuration of the WLP 52 taken along arrows Y-Y of the upper part of FIG. 6B. In this example, among the terminals arranged in a grid-like manner (row M, column N), two terminals Q1 and Q2 are arranged in positions (coordinates) indicated with (p, q) and (r, s), respectively for connecting with a wiring 58 (described below). In an exemplary configuration of the WLP 52 illustrated in FIG. 6B, metal bumps B1 and B2, which are arranged in positions (coordinates) indicated with (p, q) and (r, s), are connected to the terminals Q1 (p, q) and Q2 (r, s) for obtaining a predetermined impedance value. In the example of FIG. 6B, $0 \leq p$; $r \leq N-1$; $0 \leq q$; $s \leq M-1$. It is to be noted that the position of the target measurement terminals (e.g., P1, P2) of the integrated circuit 52 and the position of the connection terminals (Q1, Q2) could be the same or different depending on conditions, such as design conditions.

FIG. 6C illustrates portion A of FIG. 6B in further detail. Terminals Q1 (p, q) and Q2 (r, s) are connected to the wiring 58 via the metal bumps B1 (p, q) and B2 (r, s). Thereby, the WLP can attain the predetermined impedance value. Metal bumps (in this example, B1, B2) are formed for enabling the predetermined impedance value of the WLP to satisfy a desired design specification value.

The impedance value of the local region E(m) (impedance value of the integrated circuit which is to be measured) and the impedance value of each region of the WLP can be associated with each other in the following manner. That is, the impedance value of the local region can correspond with the impedance value of each region of the WLP in the following manner. More specifically, a corresponding relationship between the impedance value between two terminals of a grid-like (row M, column N) integrated circuit device and the impedance value between two terminals of a grid-like (row M, column N) WLP can be matched in accordance with design conditions (e.g., configuration of the wiring) by using a formula or the like. The pair of terminals of the integrated circuit and the pair of terminals of the WLP may be terminals located at the same or different positions. Based on the corresponding relationship, the impedance value of each local region (i.e. target measurement region) E (m) of the integrated circuit device can be converted to the impedance value generated at a corresponding region by the wiring configuration of the WLP. Accordingly, by changing the wiring configuration of the WLP with the use of the metal bumps, the impedance value of the integrated circuit device of the WLP can be changed.

The settings of the terminals or the grid-like arrangement are not limited to those applied to the above-described example. That is, the terminals may be set or arranged according to design conditions of the integrated circuit device or the design conditions of the WLP.

By performing conversion of step S1012, the impedance value B(n) of a region of the WLP requiring correction can be obtained by referring to the value RX (m) of the correction requiring data D4. It is, to be noted that "n" of the impedance value B(n) is a natural number indicating a number of a region in the WLP. Accordingly, data of a region of the WLP requiring correction (correction requiring data) D404 can be obtained.

[Step 1013, Conversion from Correction Requiring Data to Bonding Condition Data]

In Step S1013 of FIG. 4, the position for arranging metal bumps in the WLP is determined based on the correction requiring data D404. Based on the impedance value B(n) of the region of the WLP requiring correction, a bonding position BD (i, j) of the correction requiring region is calculated. The data indicating the bonding position BD (i, j) of the correction requiring region is indicated as D405 (bonding position of correction requiring region). In this example, $0 \leq i \leq N-1$ and $0 \leq j \leq M-1$. The calculation may be performed by using the corresponding relationship with respect to, for example, the impedance value of the WLP in accordance with design conditions such as the wiring configuration of the WLP.

[Step 1014, Setting Program for Bonding in Package]

Based on data of the bonding position of the correction requiring data D405 obtained in Step S1013, a program (operating program), for example, installed in a wire bonding apparatus is employed for setting a bump bonding of the WLP. Among the positions of the connection terminals 53 on the integrated circuit 52 of FIG. 5A, the position of the metal bump indicates the position for connecting to the below-described wiring 58 (see FIG. 5D). By changing the configuration of wiring by arranging the metal bump, the impedance value of the integrated circuit can be set to a desired value.

Because the position of the region of the WLP for bonding the metal bump is defined based on the data D405 in correspondence with the impedance value of the local region of the integrated circuit device, the bonding position P (i, j) is set (installed) in the program (operating program) of the wire bonding apparatus. After the completion of Step S1014, the step S101 for determining the position of bumps in a package is completed.

[Step S102, Forming of Bumps]

Step S102 of FIG. 3 is a step of forming bumps. By using the wiring bonding apparatus installed along with the operating program to which the bonding position P (i, j) is set in Step S1014 of FIG. 4, metal bumps are formed in predetermined positions on the WLP. In this example, the metal bumps have spherical shapes.

The metal bumps 55 may be formed having two superposed cylinders (narrow cylinder on top of a wide cylinder. As illustrated in FIG. 5A, metal bumps 55 are formed on the predetermined wiring terminals 53 of the integrated circuit 52 of the wafer 51. The material of the metal bumps 55 may be, for example, a metal bonding wire. Further, material such as aluminum may be used for connecting with the connection wire 53.

(Step S103, Forming of Wiring Layer)

FIG. 3 illustrates a step of forming a wiring layer (Step S103). In this embodiment, step 103 includes a process of forming an insulating layer, a process of forming a wiring, and a process of forming an outer connection terminal. The process of forming an insulating layer, the process of forming a wiring, and the process of forming an outer connection terminal are not limited to any particular method. FIGS. 5B-5E illustrate the processes of Step S103 for forming a representative example of the WLP 50.

FIG. 5B illustrates forming an insulating layer 56 on a passivation layer 54 for protecting the integrated circuit 52 according to an embodiment of the present invention. The material of the insulating layer 56 may be, for example, an epoxy type resin or a polyimide type resin. The insulating layer 56 is formed by, for example, coating with a liquid resin or laminating with a film-like resin. Then, a pressing force is applied to the insulating layer 56 formed of the resin film by using a metal plate or the like (not illustrated). Thereby, a peak protruding portion 55a of the metal bump 55 (i.e. a protruding upper part of the superposed cylinder shaped metal bump 55) is flattened and exposed at the resin surface of the insulating layer 56.

Figure 5C:
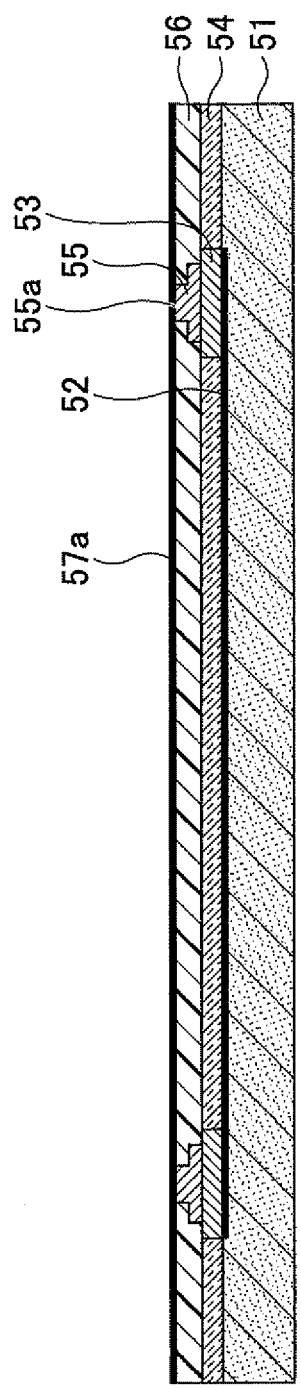

FIG. 5C illustrates forming a seed layer 57a. The seed layer 57a is formed by using, for example, a sputtering apparatus. The seed layer 57a is used in a subsequent electroplating process for forming a wiring 58.

Figure 5D:
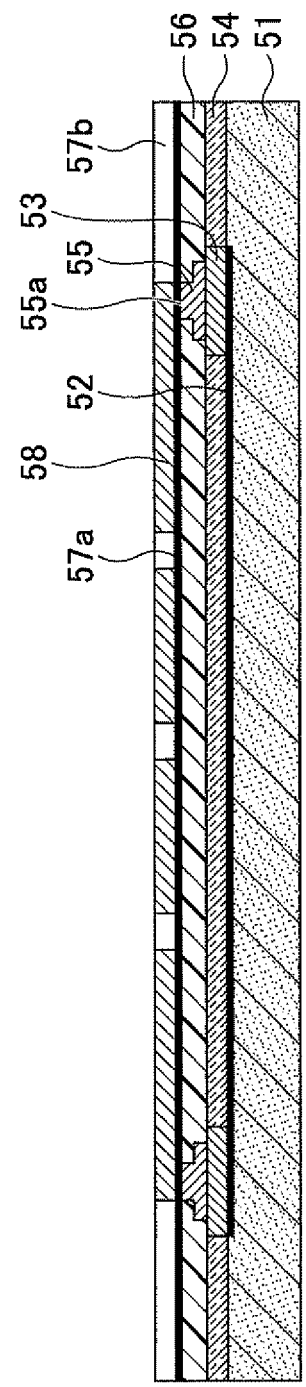

FIG. 5D illustrates forming a photo-resist layer 57b and the wiring 58. The wiring 58 is formed on the seed layer 57a by electroplating. Before the forming of the wiring 58, a coating of photo-resist is applied to form the photo-resist layer 57b on the seed layer 57a and processes of exposure/development/peeling are performed on the photo-resist layer 57b, to thereby form a space at a predetermined area of the photo-resist layer 57b. Then, by performing electroplating with use of a metal material (e.g., copper), the wiring 58 is formed in the space of the photo-resist layer 57b.

Figure 5E:
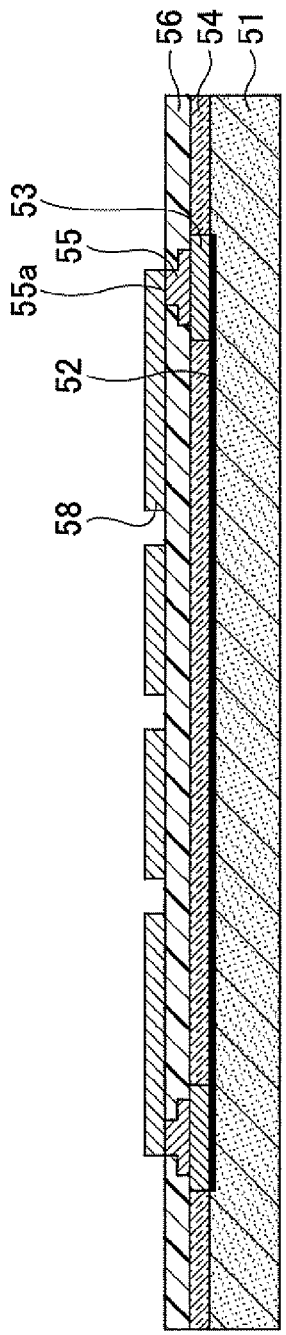

FIG. 5E illustrates removing (e.g., peeling, etching) the photo-resist layer 57b and removing predetermined areas of the seed layer 57a (not illustrated in FIG. 5E). The shape of the wiring 58 is attained by peeling the photo-resist layer 57b (illustrated in FIG. 5D) and then peeling predetermined parts of the seed layer 57a (not illustrated in FIG. 5E).

Figure 5F:
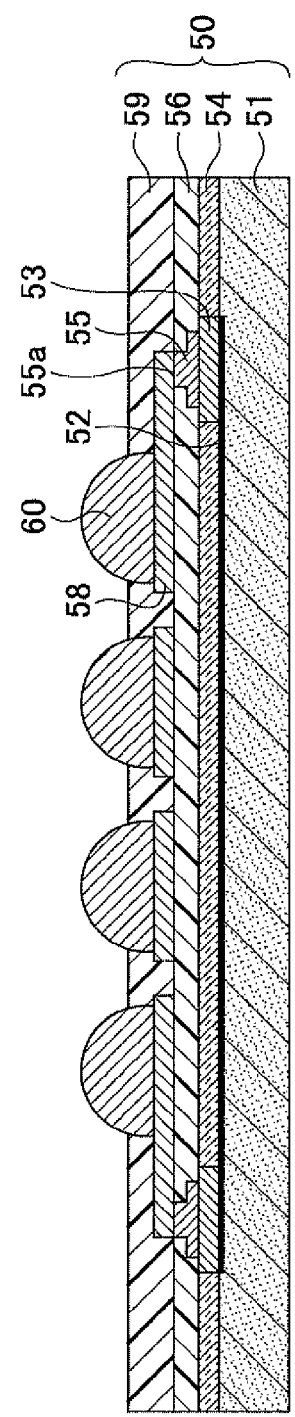

FIG. 5F illustrates the wafer level package (WLP) 50 with outer connection terminals 60 formed thereon (package state). First, a solder resist layer 59 is formed on the wiring 58 obtained in FIG. 5E. Then, spaces are formed in the solder resist layer 59. Then, the outer connection terminals 60 are formed in the spaces of the solder resist layer 59. Thereby, a WLP 50 having the integrated circuit 53 provided on the wafer 31 is formed.

Effect of the First Embodiment

Even in a case where an impedance value measured from a given area of an integrated circuit of an integrated circuit device during the steps of manufacturing the elements of the integrated circuit device is beyond a predetermined permissible range according to the design specification of the final product, the method of the first embodiment of the present invention allows the impedance value to be corrected (adjusted) to an impedance value to be within the predetermined permissible range by performing the above-described packaging operation including the steps in FIGS. 5A-5F. In other words, by selecting a suitable position for connecting metal bumps to wiring of the integrated circuit and the WLP and determining the wiring structure in the WLP, the impedance value of the integrated circuit after the packaging step can be within the predetermined permissible range according to the design specification of the final product. Thus, by selecting the position of the metal bumps and determining the wiring structure in the WLP, the conventionally required steps of preparing plural new masks and performing a new electroplating process for forming wirings can be omitted. Because such steps can be omitted, simplification of the manufacturing step and reduction of manufacturing cost can be achieved. Further, unlike the trimming method, the integrated circuit device can be prevented from receiving undesired electrical or thermal influence. Therefore, the quality of the final product of the integrated circuit device (semiconductor device) can be improved.

Second Embodiment

Figure 7A:
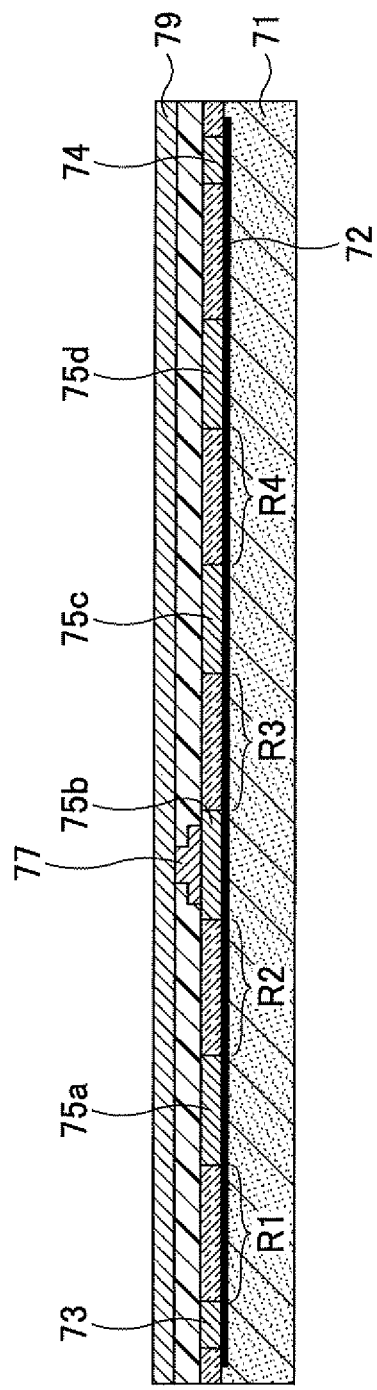
FIGS. 7A-7C are schematic diagrams for describing an example of a WLP formed according to a second embodiment of the present invention.
Figure 7B:
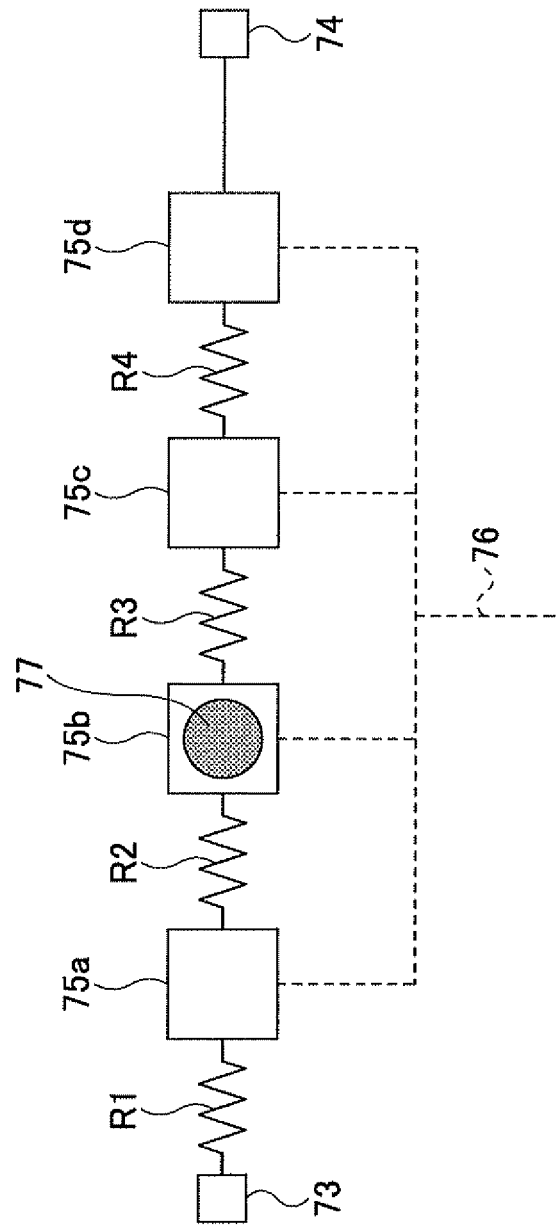
Figure 7C:
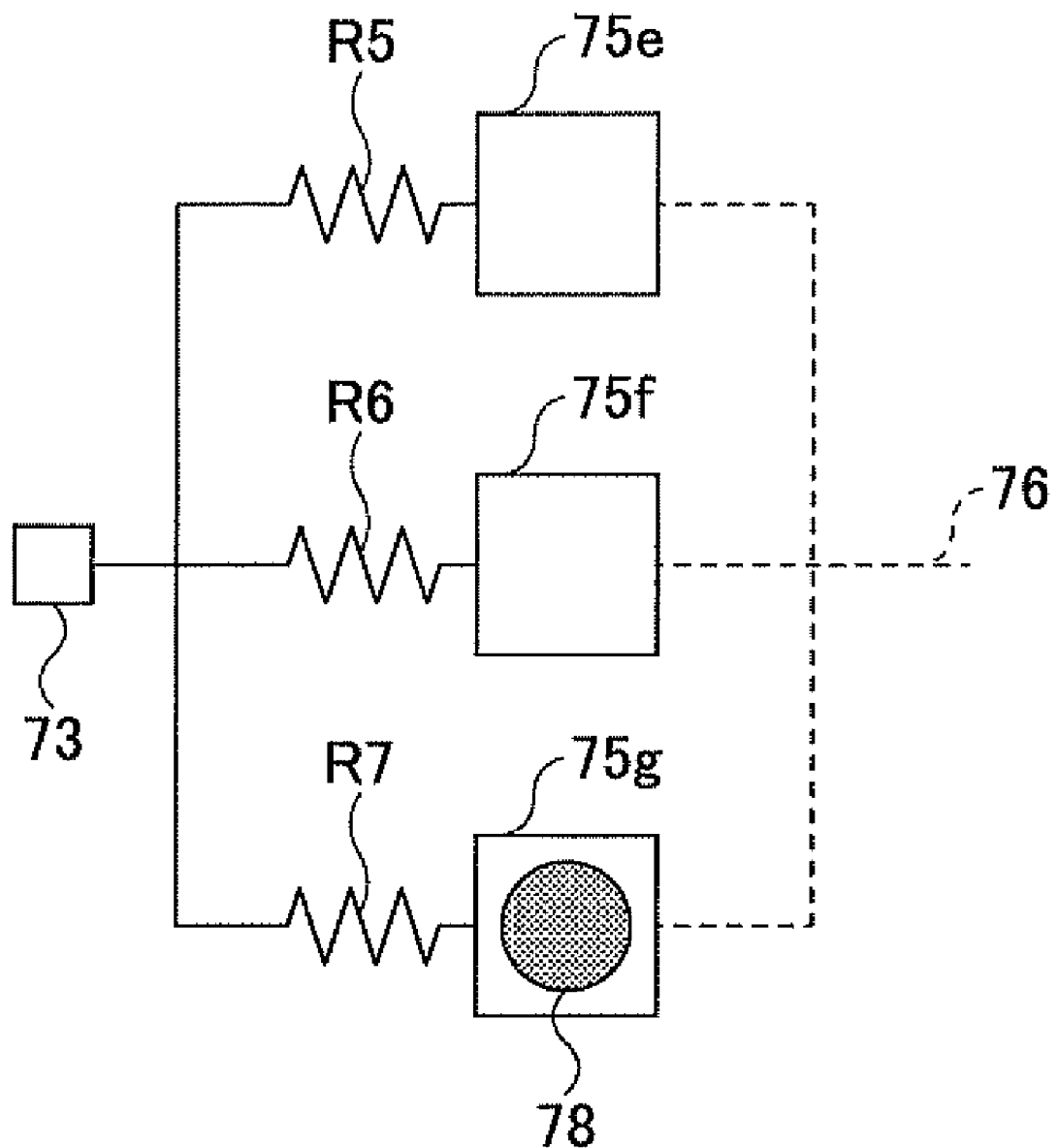

FIGS. 7A-7C are schematic diagrams for describing an example of a WLP formed according to a second embodiment of the present invention.

FIG. 7A is a cross-sectional view of a WLP of a semiconductor device including metal bumps 77 according to a second embodiment of the present invention. Even where the integrated circuit 72 is already formed on the wafer 71, a desired resistance value, being within a predetermined permissible range according to a design specification, can be selected and set to the resistance value between, for example, a terminal 73 and a terminal 74 when performing the packaging operation. In FIG. 7A, reference numeral 79 indicates a wiring layer.

FIG. 7B is a schematic diagram illustrating an equivalent circuit for describing a resistance value at a local region of a portion of the integrated circuit 72 according to a second embodiment of the present invention. In FIG. 7B, resistors R1, R2, R3, and R4 and connection terminals 75a, 75b, 75c, and 75d are provided between the terminal 73 and the terminal 74 on the integrated circuit 72. In order for the impedance value (resistance value) of a local region of a final product to be within a permissible range according to a design specification, the resistance region is set by selecting a suitable connection terminal from plural connection terminals provided for adjustment. The connection terminals 75a-75d are configured to bond to corresponding metal bumps 77. The broken line of FIGS. 7B and 7C indicates a portion of the wiring (re-distribution wiring) 76 of the WLP on which the integrated circuit 72 is to be mounted.

The input point and output point of impedance (resistance) of the local region of the entire WLP are the terminal 73 and the wiring 76. For example, in FIG. 7B, the resistance value between the terminal 73 and the terminal 74 of the integrated circuit 72 can be set as the resistance value between the terminal 73 and the terminal 75b (R1+R2) of the final product (WLP) by connecting the connection terminal 75b to the metal bump 77 of the WLP positioned at a corresponding position. Likewise, the resistance value of the final product (WLP) of the integrated circuit 72 can be set to R1, (R1+R2+

R3), or (R1+R2+R3+R4) by connecting the connection terminals 75a, 75c, or 75d to the metal bumps 77 positioned at corresponding regions. Based on the comparison between the actually measured impedance value (resistance value) of a local region and the impedance value (resistance value) within the permissible range, an optimum resistance value is selected from the resistance values. Thereby, the metal bumps can be set at positions for attaining the optimum resistance value.

The range of the value of resistors, the precision of the resistors, and the number of resistors can be discretionally set according to various conditions such as the configuration of the integrated circuit. In the example illustrated in FIGS. 7A-7C, the terminals 73, 74 and the connection terminals 75a, 75b are indicated with different reference numerals. However, both the terminals and the connection terminals of the integrated circuit may be used in the same manner depending on the design and conditions of the integrated circuit.

Effect of the Second Embodiment

The resistance value of the integrated circuit obtained during the step of forming the integrated circuit can be set (adjusted) to a predetermined resistance value of the final product by forming and adjusting the positions of metal bumps in the subsequent step forming the WLP. Thus, by selecting the position of the metal bumps and determining the wiring structure in the WLP, the conventionally required steps of preparing plural new masks and performing a new electroplating process for forming wirings can be omitted. Because such steps can be omitted, simplification of the manufacturing step and reduction of manufacturing cost can be achieved. Further, unlike the trimming method, the integrated circuit device can be prevented from receiving undesired electrical or thermal influence. Therefore, the quality of the final product of the integrated circuit device (semiconductor device) can be improved.

Modified Example of Second Embodiment

FIG. 7C is a schematic diagram illustrating another circuit for attaining a predetermined resistance value at a local region of an integrated circuit 72' according to a modified example of the second embodiment of the present invention. Compared to the configuration having serially arranged resistors R1-R4 of FIG. 75, the configuration has parallel arranged resistors R5-R7 for attaining a predetermined resistance value at a local region of the integrated circuit 72' according to the modified example of the second embodiment of the present invention. In a case of connecting metal bumps 78 to a corresponding connection terminal 75g of the integrated circuit 72' of the WLP, the resistance value of a local region of the integrated circuit 78' of the final product can be set to R7. Further, in a case of forming metal bumps 78 in correspondence with all of the connection terminals 75e, 75f, and 75g, the resistance value of the integrated circuit 72' of the WLP can be set to 1/(1/R5+1/R6+1/R7) because the integrated circuit 72' has the resistors 75e, 75f, and 75g arranged in parallel.

Effect of the Modified Example of the Second Embodiment

By arranging the resistors in parallel and forming metal bumps in correspondence with one or more of the parallel resistors, the resistance value of the integrated circuit of the WLP can be set at accurate locations. Further, improvement of product quality, reduction of manufacturing costs, and improvement of productivity can be achieved.

Third Embodiment

Figure 8A:
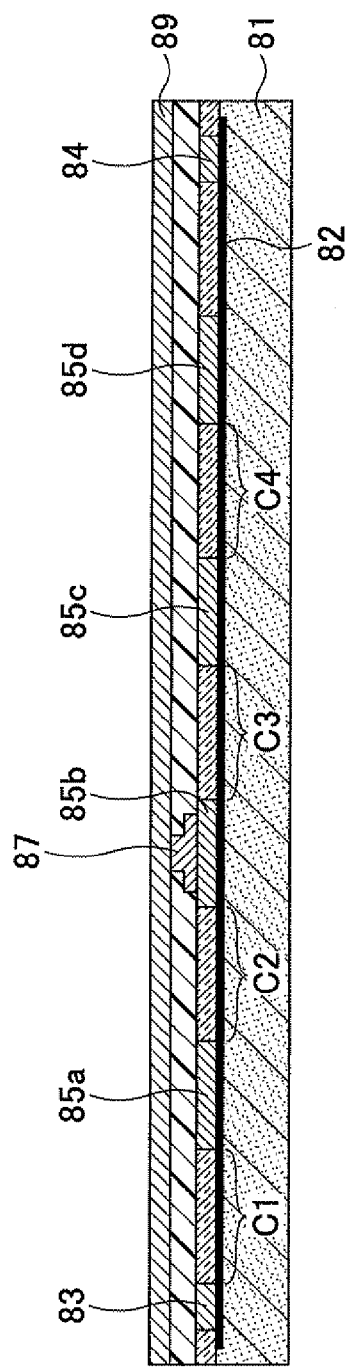
FIGS. 8A and 8B are schematic diagrams for describing a configuration of a WLP formed by a semiconductor device manufacturing method according to a third embodiment of the present invention.
Figure 8B:
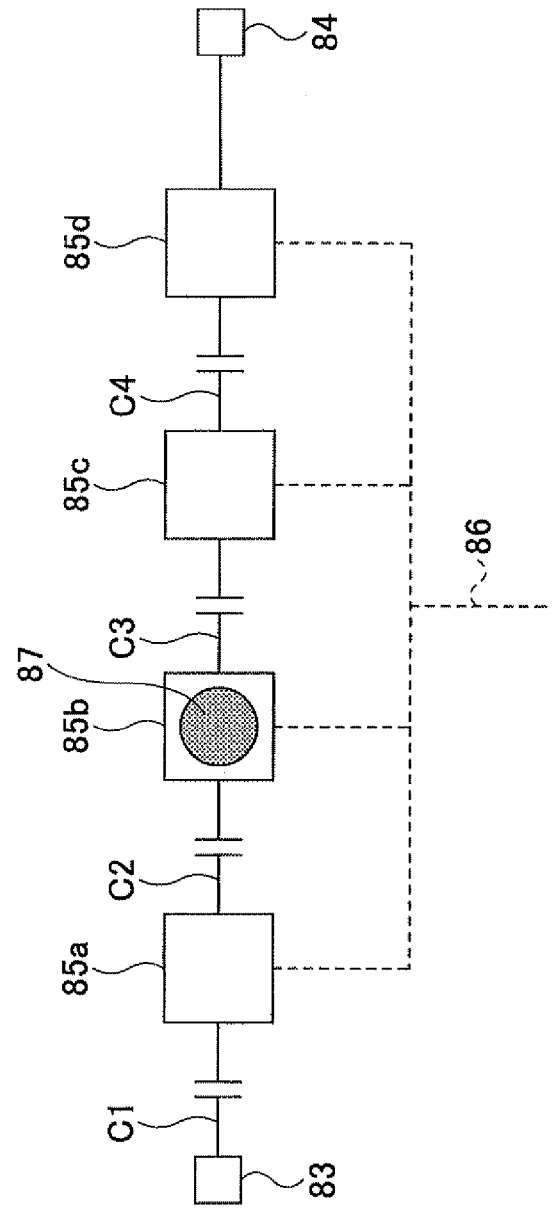

FIGS. 8A and 8B are schematic diagrams for describing a configuration of a WLP formed by a semiconductor device manufacturing method according to a third embodiment of the present invention.

FIG. 8A is a cross-sectional view of a WLP 80 of an integrated circuit 82 including a metal bump 87 according to a third embodiment of the present invention. Even after the integrated circuit 82 is formed on a wafer 81, the capacitance of the integrated circuit 82 formed on the wafer 81 can be set to be within a permissible range according to a design specification by selecting and setting a capacitance value to a position between a terminal 83 and a terminal 84 of the capacitor (condenser) groups C1-C4 in a process of forming (packaging) the WLP 80. In FIG. 8A, reference numeral 89 indicates a wiring layer.

FIG. 8B is a schematic diagram illustrating an equivalent circuit for describing a configuration of capacitors of a local region of a portion of the integrated circuit 82 according to a third embodiment of the present invention. In FIG. 8B, capacitors C1, C2, C3, C4 and connection terminals 85a, 85b, 85c, 85d are arranged between the terminal 83 and the terminal 84. The ends of the connection terminals 85a, 85b, 85c, 85d are connected to corresponding adjacent capacitors C1, C2, C3, C4. A connection terminal suitable for adjusting the impedance value (capacitance value) of a local region of a final product is selected from the connection terminals 85a-85d and connected to the inside of the package, so that the impedance value (capacitance value) can be set within a permissible range of a design specification. The connection terminals 85a-85d are configured to be joined to the corresponding metal bumps 87.

The broken line of FIG. 8B illustrates a portion of the wiring (re-distribution wiring) 86 of the WLP on which the integrated circuit 82 is to be mounted. The terminals 83, 84, the connection terminals 85a-85d, and the wiring 86 are located within the local region at which the impedance value (capacitance value) is set. The input point and output point of impedance (capacitance) of the local region of the entire WLP are the terminal 83 and the wiring 86 of the package. For example, in FIG. 8B, the capacitance value between the terminal 83 and the terminal 84 of the integrated circuit 82 can be set as the capacitance value between the terminal 83 and the terminal 85b (1/(1/C1+1/C2)) of the final product (WLP) by connecting the connection terminal 85b to the metal bump 87 of the WLP positioned at a corresponding position. Likewise, the capacitance value of the final product (WLP) of the integrated circuit 82 can be set to C1, 1/(1/C1+1/C2+1/C3) or 1/(1/C1+1/C2+1/C3+1/C4) by connecting the connection terminals 85a, 85c, or 85d to the metal bumps 87 positioned at corresponding regions. Based on the comparison between the actually measured impedance value (capacitance value) of a local region and the impedance value (capacitance value) within the permissible range, an optimum capacitance value is selected from the capacitance values. Thereby, the metal bumps can be set at positions for attaining the optimum capacitance value.

Besides the arrangement of the resistors and the capacitors described in the second and third embodiments, other types of devices (components) may also be arranged according to the status of the impedance value of the integrated circuit device.

For example, in the process of manufacturing an integrated circuit, other devices such as induction coils may also be arranged. Accordingly, by arranging induction coils, capacitors, or resistors at appropriate locations, or combinations of the induction coils, capacitors, and resistors, and selecting the locations at which metal bumps are to be formed in the operation of manufacturing the WLP, a desired characteristic such as a desired inductance value, a desired capacitance value or a desired resistance value can be attained. Therefore, the integrated circuit can attain an impedance value which is initially desired when the integrated circuit is mounted in the WLP.

It is to be noted that the range of the value of capacitors (impedance devices), the precision of the capacitors, and the number of capacitors can be discretionally set according to various conditions such as the configuration of the integrated circuit.

Effect of the Third Embodiment

The capacitance value of the integrated circuit, which is obtained after the integrated circuit is formed, can be set (adjusted) to a predetermined capacitance value of the final product by performing the packaging (re-distribution) operation including, for example, the steps of converting the measured values of the integrated circuit and adjusting the positions of metal bumps according to the measured values after the integrated circuit is formed. Accordingly, improvement of product quality, reduction of manufacturing cost, and improvement of productivity can be achieved.

[Case of a Package Having Integrated Circuit Including Plural Wiring Layers]

Although the above-described embodiments describe the packaging operation (redistribution of wiring) performed on a silicon substrate wafer where the wiring layer is a single layer, the wiring layer may be plural layers. For example, a package of an integrated circuit device may be formed having one or more insulating layers and wiring layers alternately superposed one on top of the other on the integrated circuit device where the wiring layers are connected to corresponding vias and metal bumps. Various values (e.g., impedance value) of the package can be selectively set with a large degree of freedom.

[Forming Devices on the Package Side]

The above-described embodiments describe a case where a desired value (e.g., impedance value) is attained by selectively connecting metal bumps with, for example, elements such as resistors and capacitors formed on the surface of the integrated circuit. Alternatively, elements such as resistors and capacitors may be formed on the outer surface of the package encasing the integrated circuit and be selectively connected to metal bumps for attaining a desired value (e.g., impedance value).

Further, the present invention is not limited to these embodiments, but variations and modifications may be made without departing from the scope of the present invention.

The present application is based on Japanese Priority Application No. 2009-276554 filed on Dec. 4, 2009, with the Japanese Patent Office, the entire contents of which are hereby incorporated by reference.

What is claimed is:

1. A method for manufacturing a semiconductor device, the semiconductor device including an integrated circuit having a plurality of connection terminals arranged on a predetermined local region of the integrated circuit, a plurality of metal bumps, and a wiring layer connected to at least a portion of the connection terminals via the plural metal bumps, the method comprising:

measuring an impedance value of a pair of connection terminals provided in the predetermined local region of the integrated circuit;

determining whether the difference between the measured impedance value and a design specification value corresponding to the predetermined local region is within a permissible range;

determining positions of the plural metal bumps on the integrated circuit in accordance with the determining of the difference between the measured impedance value and the design specification value;

forming the plural metal bumps on the determined positions of the integrated circuit;

forming an insulating layer above the integrated circuit after the forming of the plural metal bumps; and forming one or more wirings on the Insulating layer;

wherein when the difference between the measured impedance value and the design specification value exceeds the permissible range, the measured impedance value is converted to a predetermined impedance value and at least one of the positions of the plural metal bumps is determined in correspondence with the conversion of the measured impedance value so that the predetermined impedance value is within the permissible range in a case where the plural metal bumps are formed on the determined positions.

2. The method for manufacturing the semiconductor device as claimed in claim 1, wherein in the determining of the positions of the plural metal bumps, the positions of the plural metal bumps are determined so that an impedance value between an input point and an output point of the predetermined local region is a desired value.

3. The method for manufacturing the semiconductor device as claimed in claim 2, wherein the desired value includes a desired resistance value.

4. The method for manufacturing the semiconductor device as claimed in claim 2, wherein the desired value includes a desired capacitance value.

5. The method for manufacturing the semiconductor device as claimed in claim 2, wherein the desired value includes a desired inductance value.

6. The method for manufacturing the semiconductor device as claimed in claim 1, wherein a wire bonding apparatus is used in the forming of the plural metal bumps.

7. The method for manufacturing the semiconductor device as claimed in claim 1, further comprising forming one or more outer connection terminals on the one or more wirings.

8. The method for manufacturing the semiconductor device as claimed in claim 1, wherein the one or more wirings are formed above the plural metal bumps after the forming of the plural metal bumps.

9. The method for manufacturing the semiconductor device as claimed in claim 1, wherein a wiring structure of the semiconductor device is determined after the determining of the positions of the plural metal bumps.

* * * * *